US011870512B2

(12) United States Patent
Tang et al.

(10) Patent No.: US 11,870,512 B2
(45) Date of Patent: Jan. 9, 2024

(54) DISTRIBUTED CLOSED-LOOP POWER CONTROL WITH VGA GAIN UPDATE

(71) Applicant: Samsung Electronics Co., Ltd., Suwon-si (KR)

(72) Inventors: Yanru Tang, San Diego, CA (US); Pranav Dayal, San Diego, CA (US); Hou-Shin Chen, San Diego, CA (US); Pritesh Vora, San Diego, CA (US); Tienyu Chang, Sunnyvale, CA (US); Siuchuang Ivan Lu, San Jose, CA (US); Kee-Bong Song, San Diego, CA (US)

(73) Assignee: SAMSUNG ELECTRONICS CO., LTD.

(*) Notice: Subject to any disclaimer, the term of this patent is extended or adjusted under 35 U.S.C. 154(b) by 0 days.

(21) Appl. No.: 17/731,251

(22) Filed: Apr. 27, 2022

(65) Prior Publication Data

US 2023/0353195 A1 Nov. 2, 2023

(51) Int. Cl.
*H04B 7/04* (2017.01)
*H03F 3/24* (2006.01)
*H04B 1/04* (2006.01)

(52) U.S. Cl.
CPC ............... *H04B 7/04* (2013.01); *H03F 3/245* (2013.01); *H04B 2001/0416* (2013.01)

(58) Field of Classification Search
CPC .... H04B 7/04; H04B 2001/0416; H03F 3/245
(Continued)

(56) References Cited

U.S. PATENT DOCUMENTS

| 5,548,616 A | 8/1996 | Mucke et al. |
| 6,282,038 B1 | 8/2001 | Bonaccio et al. |

(Continued)

FOREIGN PATENT DOCUMENTS

| AU | 5567696 A | 11/1996 |
| AU | 1460701 A | 5/2002 |

(Continued)

OTHER PUBLICATIONS

Carrara, Francesco et al., "High-dynamic-range decibel-linear IF variable gain amplifier with temperature compensation for WCDMA applications", Proceedings of the 2003 International Symposium on Circuits and Systems, 2003, ISCAS'03. vol. 1.

(Continued)

*Primary Examiner* — Kevin M Burd
(74) *Attorney, Agent, or Firm* — Renaissance IP Law Group LLP

(57) ABSTRACT

A closed-loop power control (CLPC) system is disclosed that includes a first signal path for a first polarization and a second signal path for a second polarization. The first signal path includes a first power amplifier, a first output power detector configured to detect a first output power level of the first power amplifier, and a first processor configured to determine a first analog gain for a first controller and a first gain for a first digital-to-analog converter based on a first accumulated error between the first output power level and a target Effective Isotropically Radiated Power. A second processor is configured to set a first variable gain of a first variable gain amplifier coupled to an input of the first power amplifier. The CLPC can be configured to control the gain of the first signal path separately or as one signal path.

21 Claims, 9 Drawing Sheets

(58) Field of Classification Search
USPC .......................................................... 375/295
See application file for complete search history.

(56) References Cited

U.S. PATENT DOCUMENTS

| | | | |
|---|---|---|---|
| 6,721,368 B1 | 4/2004 | Younis et al. | |
| 7,026,874 B2 | 4/2006 | Vaara et al. | |
| 7,184,721 B2 | 2/2007 | Asirvatham et al. | |
| 7,205,842 B2 | 4/2007 | Gustavsson et al. | |
| 7,418,244 B2 | 8/2008 | Montalvo | |
| 7,471,738 B2 | 12/2008 | Chan et al. | |
| 8,000,408 B2 | 8/2011 | Premanakathan et al. | |
| 8,315,581 B2 | 11/2012 | Shute et al. | |
| 8,451,960 B2 | 5/2013 | Rozenblit et al. | |
| 11,102,729 B2 | 8/2021 | Langer et al. | |
| 2017/0288369 A1 | 10/2017 | Ikram et al. | |
| 2018/0006371 A1* | 1/2018 | Dang | H04W 16/28 |
| 2018/0092048 A1 | 3/2018 | Cheng et al. | |
| 2021/0399774 A1* | 12/2021 | Rafique | H04B 7/0617 |

FOREIGN PATENT DOCUMENTS

| | | | |
|---|---|---|---|
| EP | 2582038 A1 * | 4/2013 | ........... H03F 1/0272 |
| EP | 2582038 B1 | 12/2014 | |
| EP | 1364464 B1 | 4/2016 | |
| GB | 2330260 B | 2/2000 | |
| TW | 202037204 A | 10/2020 | |

OTHER PUBLICATIONS

Carrara, Francesco et al., "High-dynamic-range VGA with temperature compensation and linear-in-dB gain control", IEEE Journal of Solid-State Circuits, vol. 40, No. 10, pp. 2019-2024, Oct. 2005.

Song, Xiong et al., "A wideband dB-linear VGA with temperature compensation and active load", IEEE Transactions on Circuits and Systems I: Regular Papers, vol. 66, No. 9, pp. 3279-3287, Sep. 2019.

* cited by examiner

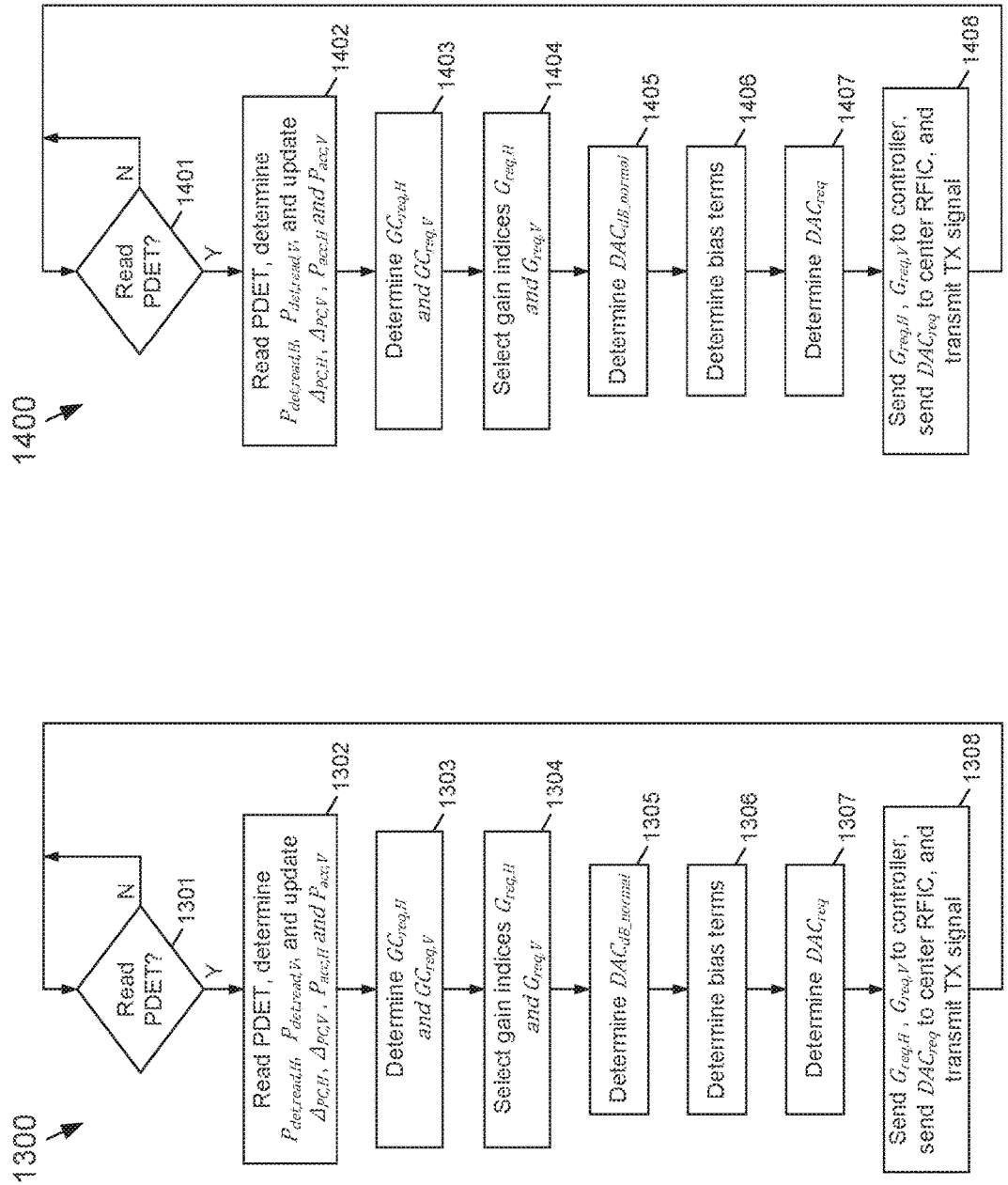

DISTRIBUTED CLOSED-LOOP POWER CONTROL WITH VGA GAIN UPDATE

TECHNICAL FIELD

The subject matter disclosed herein relates to wireless communication systems. More particularly, the subject matter disclosed here relates to closed-loop power control (CLPC) system that may be used to provide thermal compensation to an output stage of a transmitter.

BACKGROUND

Heating may adversely affect mmWave phase-array integrated circuits by causing an Effective Isotropically Radiated Power (EIRP) reduction with fixed-gain settings. An existing single-stage CLPC system provides temperature compensation by adjusting a gain (dGain) for a digital-to-analog converter (DAC). The range of the dGain for the DAC is limited and the single-stage CLPC system may fail to meet a target EIRP when a temperature of the system rapidly increases.

SUMMARY

An example embodiment provides a closed-loop power control system that may include a first power amplifier, a first output power detector, a first processor and a second processor. The first output power detector may be configured to detect a first output power level $P_{det}$ of the first power amplifier. The first processor may be configured to determine a first analog gain $G_{req}$ for a first controller and a first gain dGain for a first digital-to-analog converter that may be based on a first accumulated error between the first output power level $P_{det}$ and a target Effective Isotropically Radiated Power. The second processor may be configured to set a first variable gain $GC_{req}$ of a first variable gain amplifier coupled to an input of the first power amplifier. In one embodiment, the first processor may be further configured to communicate the first analog gain $G_{req}$ to the first controller. In another embodiment, the first processor may be further configured to determine the first analog gain $G_{req}$ and the first gain dGain that may be based on a first weighted accumulated error between the first output power level $P_{det}$ and the target EIRP. In still another embodiment, the first processor may be further configured to determine the first variable gain $GC_{req}$ of the first VGA, and communicate the first variable gain $GC_{req}$ to the first controller. In yet another embodiment, the second processor may be further configured to determine the first variable gain $GC_{req}$. In one embodiment, the second processor may determine the first variable gain $GC_{req}$ that may be based on a second accumulated error between the first output power level $P_{det}$ and the target EIRP. In another embodiment, the second processor may determine the first variable gain $GC_{req}$ that may be based on a second weighted accumulated error between the first output power level $P_{det}$ and the target EIRP. In still another embodiment, the system may include a first signal path for a first polarization and a second signal path for a second polarization in which the first signal path may include the first power amplifier, the first output power detector, the first processor, the first DAC, the first controller, and the second processor, and in which the second signal path may include a second power amplifier, a second output power detector that may be configured to detect a second output power level $P_{det}$ of the second power amplifier, a third processor that may be configured to determine a second analog gain $G_{req}$ for a second controller and a second gain dGain for a second DAC that may be based on a second accumulated error between the second output power level $P_{det}$ and the EIRP, and a fourth processor that may be configured to set a second variable gain $GC_{req}$ of a second VGA coupled to an input of the second power amplifier. In yet another embodiment, the system may include a first signal path for a first polarization and a second signal path for a second polarization in which the first signal path may include the first power amplifier, the first output power detector, the first processor, the first controller and the second processor, in which the second signal path may include a second controller, a third processor, a second VGA, and a second power amplifier, and in which the first processor may be further configured to communicate the first analog gain $G_{req}$ to the second controller and the third processor may be further configured to set a first variable gain $GC_{req}$ of the second VGA coupled to an input of the second power amplifier. In one embodiment, the first processor may be further configured to communicate the first variable gain $GC_{req}$ to the first controller and to the second controller. In another embodiment, the system may include a first signal path for a first polarization and a second signal path for a second polarization in which the first signal path may include the first power amplifier, the first output power detector, the first processor, the first DAC, the first controller, and the second processor, in which the second signal path may include a second DAC, a second controller, a third processor, a second VGA, and a second power amplifier, in which the first analog gain $G_{req}$ may include a gain for the first signal path, the first gain dGain may include a gain for the first DAC and a gain for the second DAC, and the first variable gain $GC_{req}$ may include a gain of the first VGA, in which the first processor may be further configured to determine a second analog gain $G_{req}$ for the second signal path and a second variable gain $GC_{req}$ for the second VGA, and in which the second variable gain $GC_{req}$ may be within a predetermined difference from the first variable gain $GC_{req}$.

An example embodiment provides a closed-loop power control system that may include a first signal path for a first polarization and a second signal path for a second polarization, in which the first signal path may include a first power amplifier, a first output power detector that may be configured to detect a first output power level $P_{det}$ of the first power amplifier, a first processor that may be configured to determine a first analog gain $G_{req}$ for a first controller and a first gain dGain for a first digital-to-analog converter that may be based on a first accumulated error between the first output power level $P_{det}$ and a target Effective Isotropically Radiated Power, and a second processor that may be configured to set a first variable gain $GC_{req}$ of a first variable gain amplifier coupled to an input of the first power amplifier. In one embodiment, the first processor may be further configured to communicate the first analog gain $G_{req}$ to the first controller. In another embodiment, the first processor may be further configured to determine the first analog gain $G_{req}$ and the first gain dGain that may be based on a first weighted accumulated error between the first output power level $P_{det}$ and the target EIRP. In still another embodiment, the first processor may be further configured to determine the first variable gain $GC_{req}$ of the first VGA, and communicate the first variable gain $GC_{req}$ to the first controller. In yet another embodiment, the second processor may be further configured to determine the first variable gain $GC_{req}$. In one embodiment, the second processor may determine the first variable gain $GC_{req}$ that may be based on a second accumulated error between the first output power level $P_{det}$ and the target EIRP. In another embodiment, the second processor may determine the first variable gain $GC_{req}$ that may be based on a second weighted accumulated error between the first output power level $P_{det}$ and the target EIRP. In still another embodiment, the second signal path may include a second power amplifier, a second output power detector that may be configured to detect a second output power level $P_{det}$ of the second power amplifier, a third processor that may be configured to determine a second analog gain $G_{req}$ for a second controller and a second gain dGain for a second DAC that may be based on a second accumulated error between the second output power level $P_{det}$ and the EIRP, and a fourth processor that may be configured to set a second variable gain $GC_{req}$ of a second VGA coupled to an input of the second power amplifier. In yet another embodiment, the second signal path may include a second controller, a third processor, a second VGA, and a second power amplifier in which the first processor may be further configured to communicate the first analog gain $G_{req}$ to the second controller and the third processor may be further configured to set a first variable gain $GC_{req}$ of the second VGA coupled to an input of the second power amplifier. In one embodiment, the first processor may be further configured to communicate the first variable gain $GC_{req}$ to the first controller and to the second controller.

BRIEF DESCRIPTION OF THE DRAWING

In the following section, the aspects of the subject matter disclosed herein will be described with reference to exemplary embodiments illustrated in the figure, in which:

FIG. 13 is an example embodiment of a method of a joint optimization of dGain and H/V gain for a centralized CLPC system, single IF mode (Option 1) according to the subject matter disclosed herein;

FIG. 14 is an example embodiment of a method of a joint optimization of dGain and H/V gain for a centralized CLPC system, single IF mode (Option 2) according to the subject matter disclosed herein.

DETAILED DESCRIPTION

Figure 1:
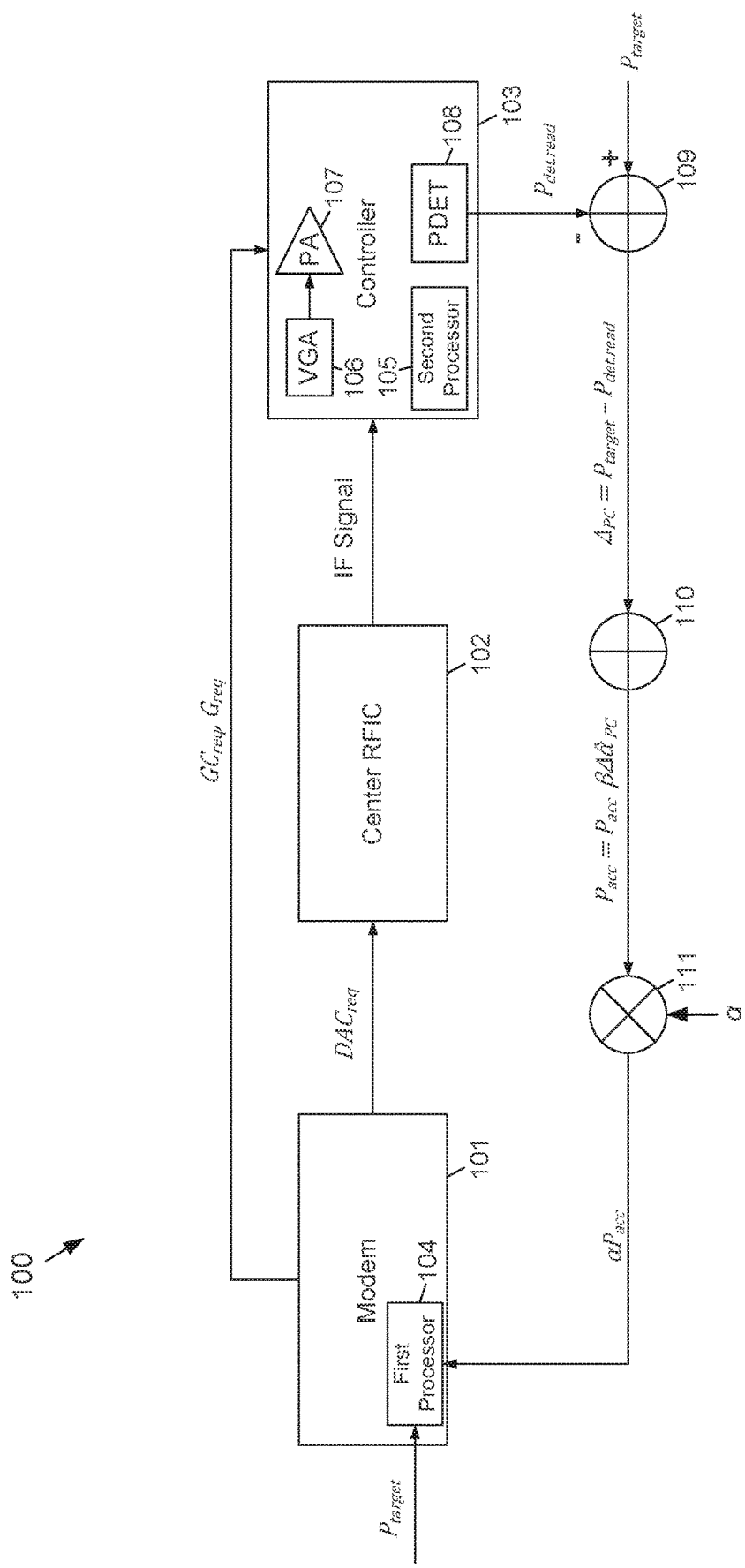
FIG. 1 depicts a block diagram of an example embodiment of a centralized CPLC system according to the subject matter disclosed herein.

In the following detailed description, numerous specific details are set forth in order to provide a thorough understanding of the disclosure. It will be understood, however, by those skilled in the art that the disclosed aspects may be practiced without these specific details. In other instances, well-known methods, procedures, components and circuits have not been described in detail to not obscure the subject matter disclosed herein.

Reference throughout this specification to "one embodiment" or "an embodiment" means that a particular feature, structure, or characteristic described in connection with the embodiment may be included in at least one embodiment disclosed herein. Thus, the appearances of the phrases "in one embodiment" or "in an embodiment" or "according to one embodiment" (or other phrases having similar import) in various places throughout this specification may not necessarily all be referring to the same embodiment. Furthermore, the particular features, structures or characteristics may be combined in any suitable manner in one or more embodiments. In this regard, as used herein, the word "exemplary" means "serving as an example, instance, or illustration." Any embodiment described herein as "exemplary" is not to be construed as necessarily preferred or advantageous over other embodiments. Additionally, the particular features, structures, or characteristics may be combined in any suitable manner in one or more embodiments. Also, depending on the context of discussion herein, a singular term may include the corresponding plural forms and a plural term may include the corresponding singular form. Similarly, a hyphenated term (e.g., "two-dimensional," "pre-determined," "pixel-specific," etc.) may be occasionally interchangeably used with a corresponding non-hyphenated version (e.g., "two dimensional," "predetermined," "pixel specific," etc.), and a capitalized entry (e.g., "Counter Clock," "Row Select," "PIXOUT," etc.) may be interchangeably used with a corresponding non-capitalized version (e.g., "counter clock," "row select," "pixout," etc.). Such occasional interchangeable uses shall not be considered inconsistent with each other.

Also, depending on the context of discussion herein, a singular term may include the corresponding plural forms and a plural term may include the corresponding singular form. It is further noted that various figures (including component diagrams) shown and discussed herein are for illustrative purpose only, and are not drawn to scale. For example, the dimensions of some of the elements may be exaggerated relative to other elements for clarity. Further, if considered appropriate, reference numerals have been repeated among the figures to indicate corresponding and/or analogous elements.

The terminology used herein is for the purpose of describing some example embodiments only and is not intended to be limiting of the claimed subject matter. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

It will be understood that when an element or layer is referred to as being on, "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

The terms "first," "second," etc., as used herein, are used as labels for nouns that they precede, and do not imply any type of ordering (e.g., spatial, temporal, logical, etc.) unless explicitly defined as such. Furthermore, the same reference numerals may be used across two or more figures to refer to parts, components, blocks, circuits, units, or modules having the same or similar functionality. Such usage is, however, for simplicity of illustration and ease of discussion only; it does not imply that the construction or architectural details of such components or units are the same across all embodiments or such commonly-referenced parts/modules are the only way to implement some of the example embodiments disclosed herein.

Unless otherwise defined, all terms (including technical and scientific terms) used herein have the same meaning as commonly understood by one of ordinary skill in the art to which this subject matter belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "module" refers to any combination of software, firmware and/or hardware configured to provide the functionality described herein in connection with a module. For example, software may be embodied as a software package, code and/or instruction set or instructions, and the term "hardware," as used in any implementation described herein, may include, for example, singly or in any combination, an assembly, hardwired circuitry, programmable circuitry, state machine circuitry, and/or firmware that stores instructions executed by programmable circuitry. The modules may, collectively or individually, be embodied as circuitry that forms part of a larger system, for example, but not limited to, an integrated circuit (IC), system on-a-chip (SoC), an assembly, and so forth.

The subject matter disclosed herein relates to a multi-stage closed-loop power control (CLPC) system for temperature compensation in which first and second processors adjusts an analog gain, a dGain, and a Variable Gain Amplifier (VGA) gain based on a Power Detect (PDET) reading so that the CLPC system meets a target EIRP.

In one embodiment, the multi-stage CLPC system disclosed herein provides a centralized CLPC system in which the first determines the analog gain, the dGain, and the VGA gain based on a single accumulated error between a PDET reading and a target EIRP, and communicates the dGain to an IF stage, and communicates VGA gain settings to a controller. In another embodiment, the multi-stage CLPC system disclosed herein provides a distributed CLPC system in which the first processor adjusts the analog gain and the dGain, and the second processor adjusts the VGA gain. In the second embodiment, the first and second processors may base the respective adjustments on separately accumulated errors between a PDET reading and a target EIRP.

In the following description, $T_{VGA}(GC_i)$ denotes an accumulated VGA gain corresponding to a VGA gain index $GC_i$, and $GC_{cal}$ and $DAC_{set\_cal}$ respectively denote a GC index and a DAC value used in calibration.

FIG. 1 depicts a block diagram of an example embodiment of a centralized CPLC system 100 according to the subject matter disclosed herein. The centralized CPLC system 100 includes a modem 101, a center RFIC 102, a controller 103, a first adder 109, a second adder 110 and a multiplier 111. The modem 101 includes a first processor 104. The controller 103 includes a second processor 105, a VGA 106, a power amplifier (PA) 107, and a power detector (PDET) 108. The various components forming the centralized CLPC system 100 may be separate components and/or modules, and/or may be combined into one or more components and/or modules.

The modem 101 receives a target power value $P_{target}$ and an accumulated error value $\alpha P_{acc}$, and outputs a DAC gain value $DAC_{req}$ to the center RFIC 102. The modem 101 also outputs a $GC_{req}$ value and a $G_{req}$ value to the controller 103. The center RFIC outputs an IF signal to the controller 103. The PDET 108 of the controller 103 outputs a power detection value $P_{det.read}$ to the first adder 109. The first adder 109 also receives the target power value $P_{target}$ and outputs to the second adder 110 a $\Delta_{PC}$ value that is a difference between $P_{target}$ and $P_{det.read}$. The second adder 110 outputs an accumulated power error value $P_{acc}$ that is a previous power error value $P_{acc}$ plus the $\Delta_{PC}$ value weighted by a gain value $\beta$. The accumulated power error value $P_{acc}$ is then multiplied by a loop gain value $\alpha$ at the multiplier 111 to form $\alpha P_{acc}$ which is input to the modem 101.

For temperature compensation, centralized CLPC has a VGA gain and a DAC dGain value that are updated based on $\alpha P_{acc,centralized}$, which provides a smooth convergence of the actual EIRP to a target value. The centralized CLPC system 100 of FIG. 1 may, however, involve a large number of commands to notify the second processor 105 in the controller 103 of the updated VGA gain selection.

To reduce the number of commands, the subject matter disclosed herein also provides a distributed CLPC in which the second processor 105 in the controller 103 selects the VGA gain and the first processor 104 in the modem 101 selects the analog gain and the DAC dGain value to meet a target EIRP. The second processor 105 selects a VGA gain from a VGA gain table based on an error that has been accumulated at the controller 103. The first processor 104 selects an analog gain according to a target EIRP and a DAC dGain value based on an error that has been accumulated at the modem 101. The distributed CLPC disclosed herein provides for both dual IF and single IF modes. In one embodiment, distributed CLPC disclosed herein provides the same performance as the centralized CLPC system 100 for temperature compensation, but with a reduced number of commands. The centralized and the distributed CLPC disclosed herein also meets a target power requirement for a larger temperature variation than a traditional single-stage CLPC system. When the temperature rises quickly, the traditional single-stage CLPC system may not meet a target EIRP because the DAC range is limited. With the centralized and distributed CLPC systems disclosed herein, a target EIRP may always be met with a DAC dGain value within a relatively small range.

Figure 2:
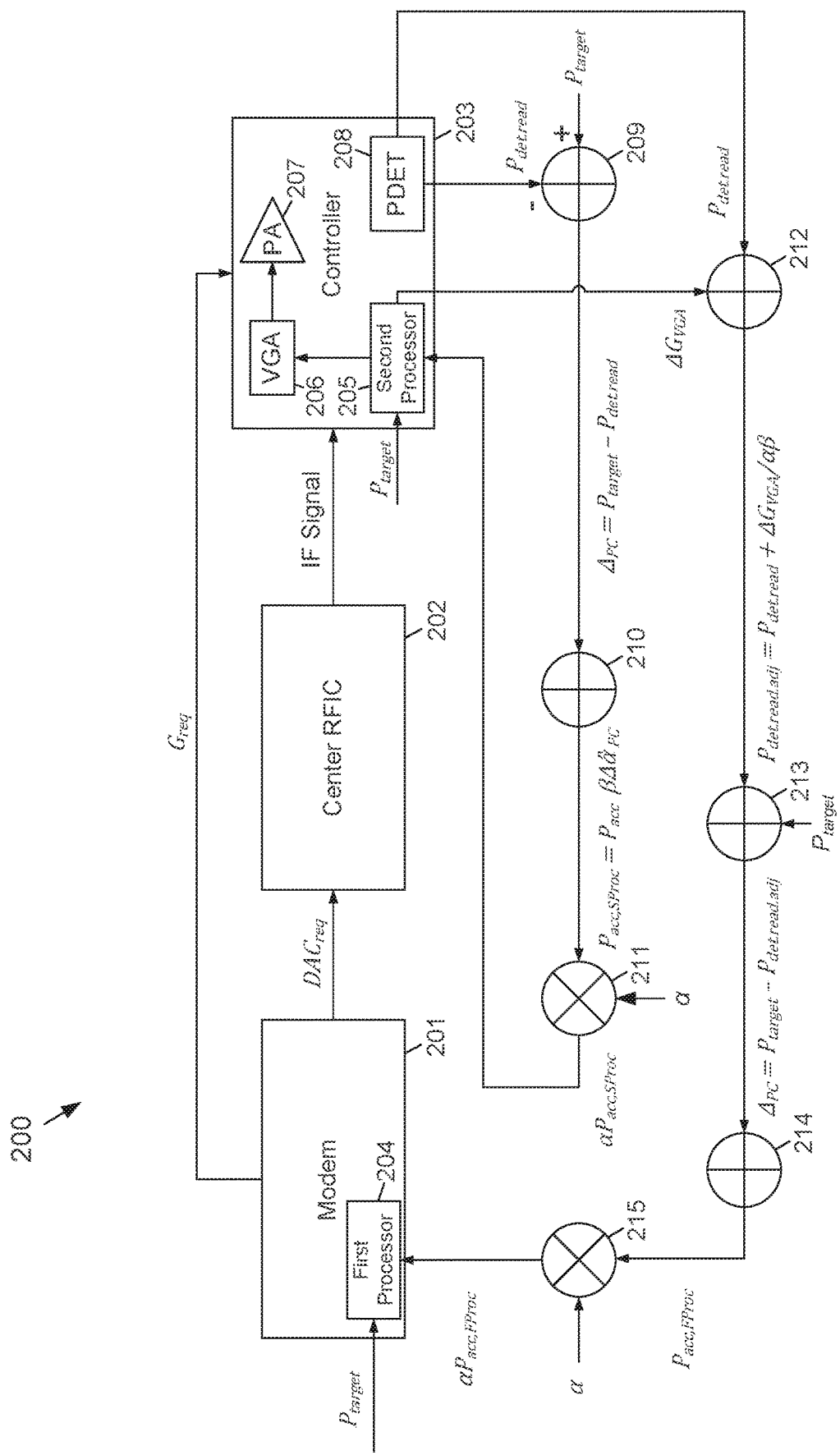
FIG. 2 depicts a block diagram of an example embodiment of a distributed CLPC system according to the subject matter disclosed herein.

FIG. 2 depicts a block diagram of an example embodiment of a distributed CLPC system 200 according to the subject matter disclosed herein. The distributed CPLC system 200 includes a modem 201, a center RFIC 202, a controller 203, a first adder 209, a second adder 210, a first multiplier 211, a third adder 212, a fifth adder 213, a sixth adder 214, and a second multiplier 215. The modem 201 includes a first processor 204. The controller 203 includes a second processor 205, a VGA 206, a PA 207, and a PDET 208. The various components forming the distributed CLPC system 200 may be separate components and/or modules, and/or may be combined into one or more components and/or modules.

The modem 201 receives a target power value $P_{target}$ and an accumulated error value $\alpha P_{acc,FProc}$, and outputs a DAC dGain value $DAC_{req}$ to the center RFIC 202. The modem 201 also outputs a $G_{req}$ value to the controller 203. The center RFIC 202 outputs an IF signal to the controller 203. The PDET 208 of the controller 203 outputs a power detection value $P_{det,read}$ to the first adder 209. The first adder 209 also receives the target power value $P_{target}$ and outputs to the second adder 210 a $\Delta_{PC}$ value that is a difference between $P_{target}$ and $P_{det,read}$. The second adder 210 outputs an accumulated power error value $P_{acc}$ that is a previous power error value $P_{acc}$ plus the $\Delta_{PC}$ value weighted by a gain value $\beta$. The accumulated power error value $P_{acc}$ is then multiplied by a loop gain value $\alpha$ at the multiplier 211 to form $\alpha P_{acc,SProc}$, which is input to the second processor 205. $P_{target}$ is also input to the second processor 205.

The third adder 212 receives the power detection value $P_{det,read}$ and a $\Delta G_{VGA}$ signal output from the second processor 205. The third adder 212 outputs an adjusted power detection signal to the fourth adder 213. The fourth adder 213 outputs a $\Delta_{PC}$ signal that is updated by the fifth adder 214 to form $P_{acc,FProc}$. $P_{acc,FProc}$ multiplied by a at the second multiplier 215 to form $\alpha_{Pacc,FProc}$, which is input to the first processor 204.

Figure 3A:
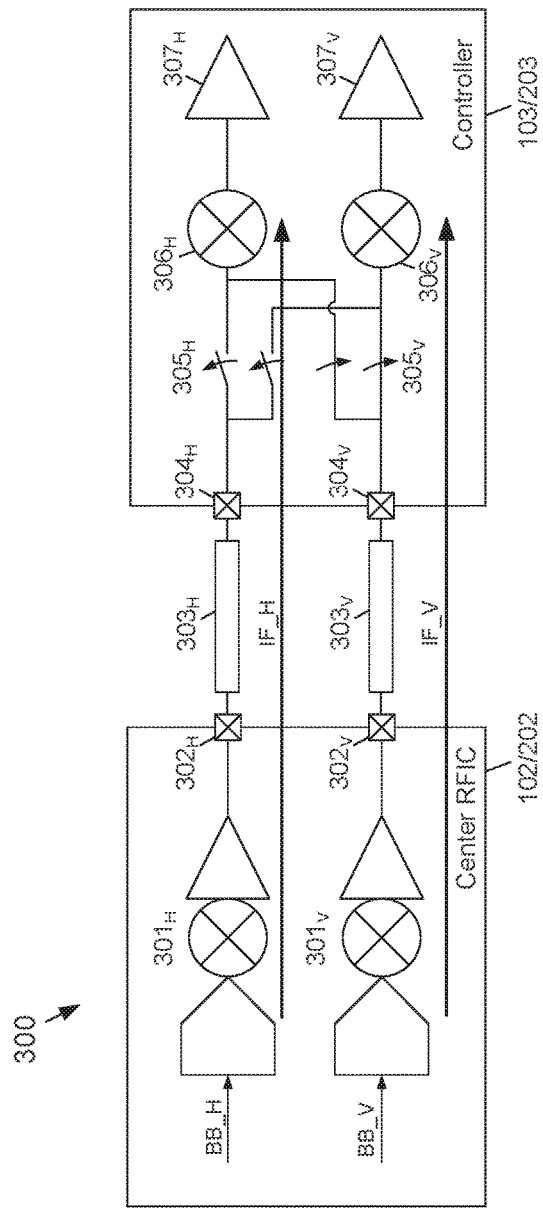
FIGS. 3A and 3B respectively depict block diagrams of example embodiments of a dual IF mode and a single IF mode for the CLPC systems according to the subject matter disclosed herein.
Figure 3B:
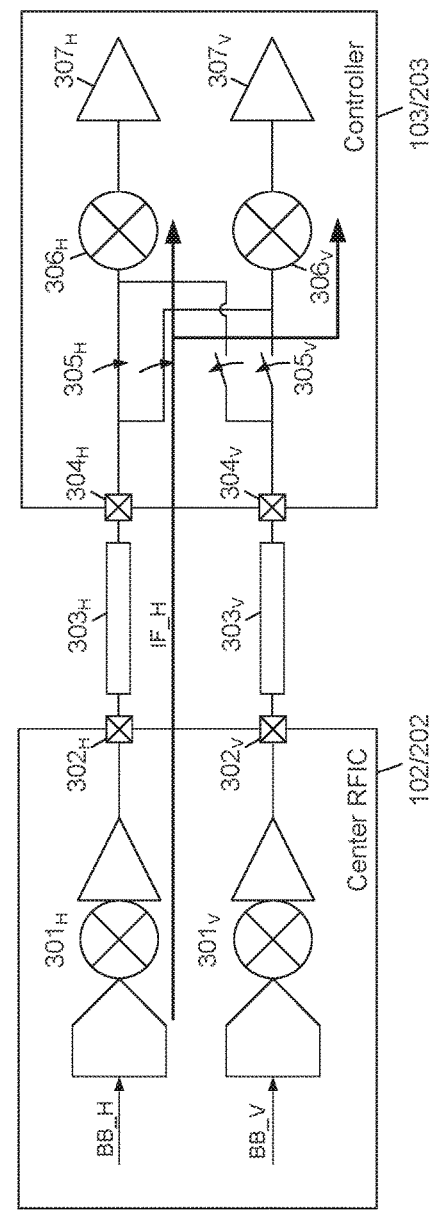

The CLPC system 100 and the CLPC system 200 may be operated in a dual IF mode or in a single IF mode. FIGS. 3A and 3B respectively depict block diagrams of example embodiments of a dual IF mode 300 and a single IF mode 350 for the CLPC systems according to the subject matter disclosed herein. A portion of the center RFIC 102/202 and a portion of the controller 103/303 are depicted in both FIGS. 3A and 3B.

The RFIC 102/202 includes DACs $301_H$ and $301_V$. The DAC $301_H$ receives a baseband H signal BB_H. The DAC $301_V$ receives a baseband V signal BB_V. The respective outputs of DACs $301_H$ and $301_V$ are input to the controller 103/203 through RFIC terminals 302H and 302V, transmission lines $303_H$ and $303_V$ to controller terminals $304_H$ and $304_V$. In one embodiment, the controller 103/203 includes a first double-pole, single-throw (DPST) switch $305_H$, a second DPST switch $305_V$, a first mixer $306_H$, a second mixer $306_V$, a first power amplifier $307_H$ and a second power amplifier $307_V$. The two DPST switches 305H and 305V allow either the IF-H signal or the IF_V to be selected for operation in the single IF mode. In an alternative embodiment, one of the two DPST switches 305 may be replaced by a single-pole, single-throw (SPST) switch, in which case the IF signal path containing the DPST switch 305 will be the IF polarization that CPLC controlled for both IF channels.

In the dual IF mode, the first DPST switch $305_H$ may be controlled so that the IF_H signal passes through the first DPST switch $305_H$ to the first mixer $306_H$ and the first power amplifier $307_H$. Similarly, the second DPST switch $305_V$ may be controlled so that the IF_V signal passes through the second DPST switch $303_V$ to the second mixer $306_V$ and the second power amplifier $30'7v$. In the single IF mode, the first DPST switch $305_H$ and the second DPST switch $305_V$ may be controlled so that the IF_H signal is coupled to both mixers $306_H$ and $306_V$, while the IF_V signal is disconnected from the mixer $306_V$.

That is, for the dual IF mode, both streams of data are on and IF_H and IF_V may have different information. In a single IF mode, there is only one stream of data transmitted from both H and V antennas. As H and V paths are able to separately select analog gain, VGA gain and dGain in the dual IF mode, the following descriptions focus on a single IF path because the other polarization operates in a similar manner.

Figure 4:
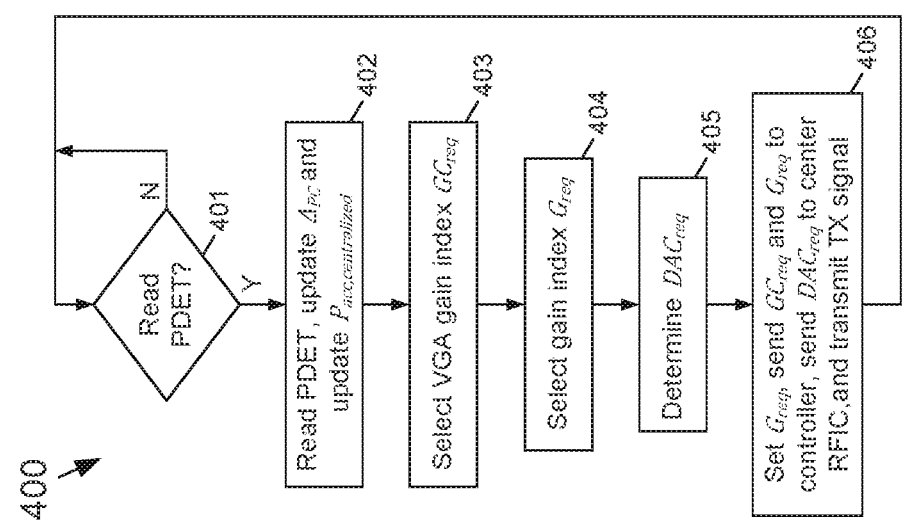
FIG. 4 is a flowchart of an example embodiment of a method for a dual IF mode centralized CLPC system (single polarization) according to the subject matter disclosed herein.

FIG. 4 is a flowchart of an example embodiment of a method 400 for a dual IF mode centralized CLPC system (single polarization) according to the subject matter disclosed herein. The modem 101 periodically issues a PDET reading command. At 401, the second processor 105 determines whether a PDET reading command has been issued by the modem 101. If not, flow remains at 401. If so, flow continues to 402 where the PDET 108 is read to obtain $P_{det,read}$. Additionally at 402, $\Delta_{PC}$ is updated by the first adder 109 as $$\Delta_{PC} = P_{target} - P_{det,read}, \tag{1}$$

and the second adder 110 updates $P_{acc}$, centralized as $$P_{acc,centralized} = P_{acc,centralized} + \beta \Delta_{PC} \tag{2}$$

in which $\beta$ is based on the number of resource block (RB) size and is described in connection with Eq. (12).

At 403, a VGA gain index $GC_{req}$ is selected by the first processor 104 from a VGA gain table $T_{VGA}$ based on $$GC_{req} = ^{armin}GC_i |\alpha P_{acc,centralized} - T_{VGA}(GC_i) + T_{VGA}(GC_{cal})|. \tag{3}$$

At 404, $DAC_{dB\_normal}$ is determined by the first processor 104 as $$DAC_{dB_{normal}} = DAC_{set_{cal}} + (P_{target} - P_{G_{req}}) + \alpha P_{acc,centralized} - (T_{VGA}(GC_i) - T_{VGA}(GC_{cal})) \tag{4}$$

in which α is a loop gain. $P_{\alpha cc,centralized}$ is multiplied by α by the multiplier 111 to form $\alpha P_{\alpha cc,centralized}$. ($\alpha P_{\alpha cc}$ in FIG. 1).

At 405, $DAC_{req}$ is determined by the first processor 104 as $$DAC_{req}=\max(\min(DAC_{dB\_normal},DAC_{max}),DAC_{min}). \quad (5)$$

At 406, the first processor 104 sets $GC_{req}$ to be the selected VGA gain index, and $GC_{req}$ and $G_{req}$ are communicated to the controller 103. The first processor 104 also communicates the $DAC_{req}$ to the center RFIC 102. The Tx signal is transmitted by the controller 103, and flow returns to 401.

Figure 5:
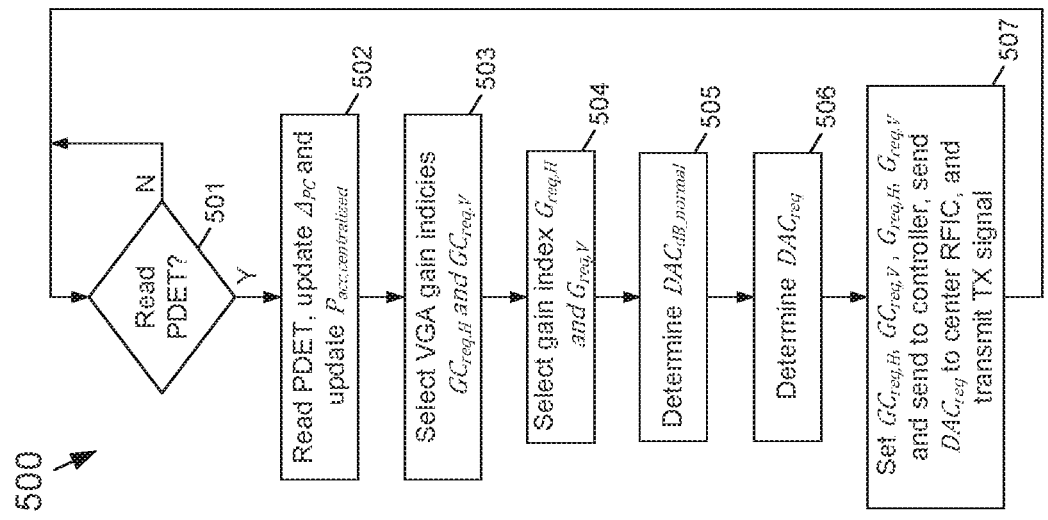
FIG. 5 is a flowchart for an example embodiment of a method for a single IF mode centralized CLPC system according to the subject matter disclosed herein.

FIG. 5 is a flowchart for an example embodiment of a method 500 for a single IF mode centralized CLPC system according to the subject matter disclosed herein. The modem 101 periodically issues a PDET reading command. At 501, the second processor 105 determines whether a PDET reading command has been issued by the modem 101. If not, flow remains at 501. If so, flow continues to 502 where the PDET 108 is read to obtain $P_{det,read}$. Additionally at 502, $\Delta_{PC}$ is updated by the first adder 109 as $$\Delta_{PC} = P_{target} - 10\log_{10}\left(10^{\frac{P_{det,read,H}}{10}} + 10^{\frac{P_{det,read,V}}{10}}\right) \quad (6)$$

in which $P_{target}$ is the target power for H+V. $P_{\alpha cc,centralized}$ ($P_{\alpha cc}$ in FIG. 1) is updated by the second adder 110 as $$P_{\alpha cc,centralized}=P_{\alpha cc,centralized}+\beta\Delta_{PC}. \quad (7)$$

At 503, the first processor 104 selects a VGA gain index $GC_{req,H}$ for the H polarization and a VGA gain index $GC_{req,V}$ for the V polarization as $$GC_{req,H}=^{argmin}_{GC_i}|\alpha P_{\alpha cc,SProc}-T_{VGA,H}(GC_i)+T_{VGA,H}(GC_{cal,H})|, \text{ and} \quad (8)$$

$$GC_{req,V}=^{argmin}_{GC_i}|\alpha P_{\alpha cc,SProc}-T_{VGA,V}(GC_i)+T_{VGA,V}(GC_{cal,V})|. \quad (9)$$

At 504, the first processor 104 selects a gain index $G_{req,H}$ for H and a gain index $G_{req,V}$ for V the H/V gain table based on $P_{lookup}=P_{target}-3$. At 505, the first processor 104 determines $DAC_{dB\_normal}$ as $$DAC_{dB_{normal}} = DAC_{set_{cal}} +$$
$$\left(P_{target} - 10\log_{10}\left(10^{\frac{T_{VGA,H}(GC_{req,H})-T_{VGA,H}(GC_{cal,H})+P_{G_{req,H}}}{10}} + \right.\right.$$
$$\left.\left.10^{\frac{T_{VGA,V}(GC_{req,V})-T_{VGA,V}(GC_{cal,V})+P_{G_{req,V}}}{10}}\right)\right) + \alpha P_{\alpha cc,centralized}. \quad (10)$$

At 506, the first processor 104 determines $DAC_{req}$ as $$DAC_{req}=\max(\min(DAC_{dB\_normal},DAC_{max}),DAC_{min}). \quad (11)$$

At 507, the first processor 104 sets $GC_{req},H$ for H and $GC_{req,V}$ for V based on the VGA gain indices selected, and $GC_{req,H}$, $GC_{req,V}$, $G_{req,H}$ and $G_{req,V}$ are communicated to the controller 103. The first processor 104 also communicates the $DAC_{req}$ to the center RFIC 102. The Tx signal is transmitted, and flow returns to 501.

For a distributed CLPC system 200, the second processor 205 selects a VGA gain index $GC_{req}$ and a first processor 204 selects an analog gain index $G_{req}$ and a dGain $DAC_{req}$ to meet a target power. $GC_{cal}$ and $DAC_{set\_cal}$ as used herein respectively denote a VGA gain index and a DAC value used in calibration.

The error between PDET and a target power may be accumulated using different weights β which may be determined based on the number of resource block (RB) size, e.g., $$\beta = \begin{cases} 1 & \text{if } RB \text{ size} < 10 \\ 4 & \text{otherwise.} \end{cases} \quad (12)$$

Based on Eq. (12), the larger the RB size, the greater the error accumulation. Without being otherwise specified, loop gain a may be fixed, e.g., α=1/16.

Figures 6, 7, 8:
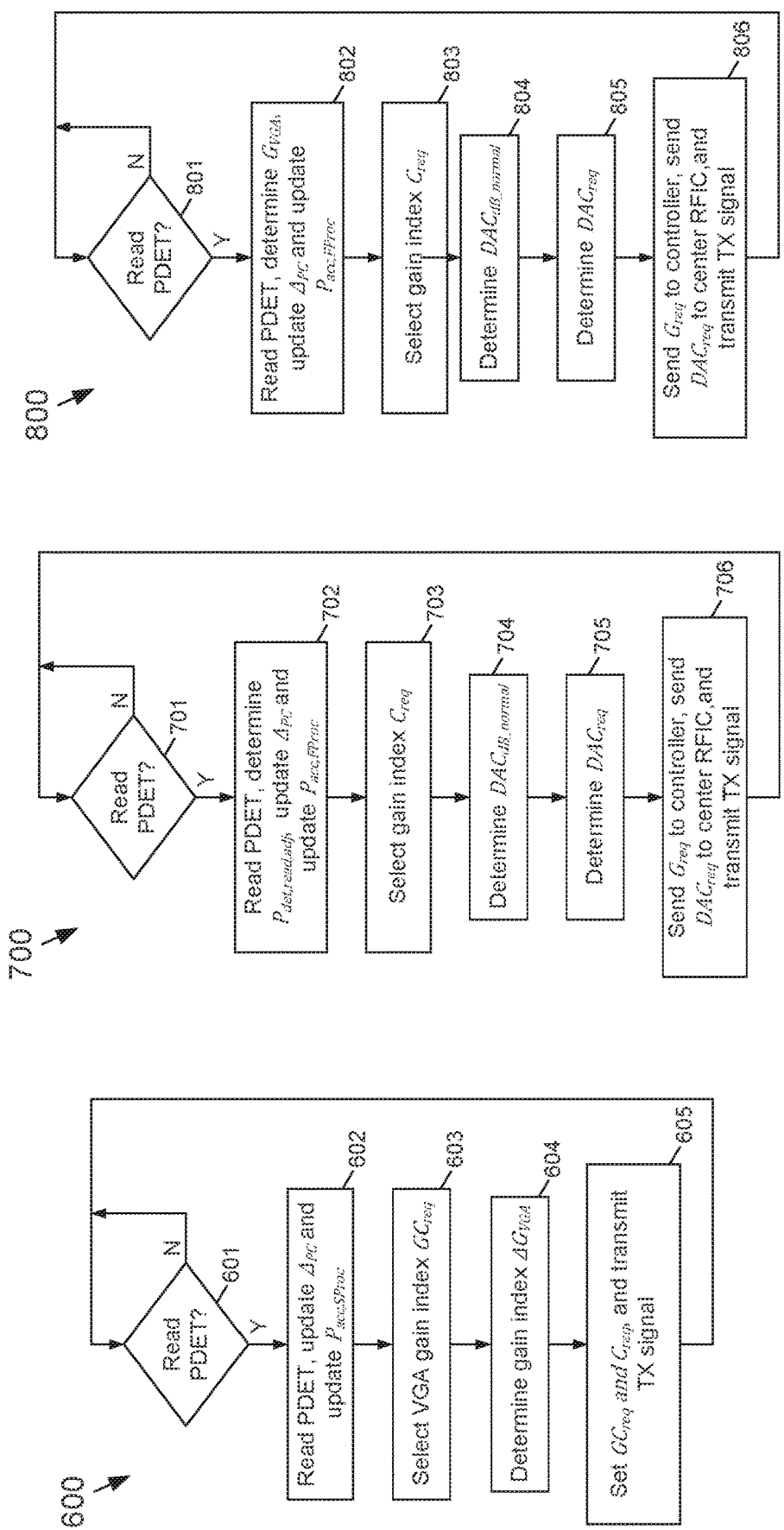
FIG. 6 is an example embodiment of a method for a dual IF mode distributed CLPC system for the second processor according to the subject matter disclosed herein.
FIG. 7 is an example embodiment of a method for a dual IF mode distributed CLPC system for the first processor (Option 1) according to the subject matter disclosed herein.
FIG. 8 is an example embodiment of a method for a dual IF mode distributed CLPC system for the first processor (Option 2) according to the subject matter disclosed herein.

FIG. 6 is an example embodiment of a method 600 for a dual IF mode distributed CLPC system for the second processor (SProc) 205 according to the subject matter disclosed herein. The modem 201 periodically issues a PDET reading command. At 601, the second processor 205 determines whether a PDET reading command has been issued. If not, flow remains at 601. If so, flow continues to 602 where the PDET 208 is read to obtain $P_{det,read}$. Additionally at 602, $\Delta_{PC}$ is updated at the first adder 209 as $$\Delta_{PC}=P_{target}-P_{det,read} \quad (13)$$

and the second adder 210 updates $P_{\alpha cc,SProc}$ as $$P_{\alpha cc,SProc}=P_{\alpha cc,SProc}+\beta\Delta_{PC} \quad (14)$$

in which β is based on the number of resource block (RB) size and is described in connection with Eq. (12).

At 603, the second processor 205 selects a VGA gain index $GC_{req}$ from a VGA gain table $T_{VGA}$ based on $$GC_{req}=^{argmin}_{GC_i}|\alpha P_{\alpha cc,SProc}-T_{VGA}(GC_i)+T_{VGA}(GC_{cal})|. \quad (15)$$

At 604, the second processor 205 determines $\Delta G_{VGA}$ as $$\Delta G_{VGA}=T_{VGA}(GC_{req})-T_{VGA}(GC_{req,prev}). \quad (16)$$

$\Delta G_{VGA}$ is provided to the first processor 204. At 605, the second processor 205 sets $GC_{req}$ to be the selected VGA gain index. The controller 203 is set with $G_{req}$ received from the first processor 204, and the Tx signal is transmitted. Flow returns to 601.

FIG. 7 is an example embodiment of a method 700 for a dual IF mode distributed CLPC for the first processor (FProc) 204 (Option 1) according to the subject matter disclosed herein. The modem 201 periodically issues a PDET reading command. At 701, the second processor 205 determines whether a PDET reading command has been issued. If not, flow remains at 701. If so, flow continues to 702 where $P_{det,read,adj}$ is determined by the third adder 212 as $$P_{det,read,adj}=P_{det,read}+\Delta G_{VGA}/\alpha\beta, \quad (17)$$

the fourth adder 213 updates $\Delta_{PC}$ as $$\Delta_{PC}=P_{target}-P_{det,read,adj}, \text{ and} \quad (18)$$

the fifth adder 214 updates $P_{\alpha cc,FProc}$ as $$P_{\alpha cc,FProc}=P_{\alpha cc,FProc}+\beta\Delta_{PC}. \quad (19)$$

At 703, the first processor 204 selects a gain index $G_{req}$ from a gain table based on $P_{lookup}=P_{target}$. At 704, the first processor 204 determines $DAC_{dB\_normal}$ as $$DAC_{dB\_normal}=DAC_{set\_cal}+(P_{target}-P_{G_{req}})\alpha P_{\alpha cc,FProc}. \quad (20)$$

At 705, the first processor determines $DAC_{req}$ as $$DAC_{req}=\max(\min(DAC_{dB\_normal},DAC_{max}),DAC_{min}). \quad (21)$$

At 706, the first processor communicates $G_{req}$ to the controller 203 and $DAC_{req}$ to the center RFIC 202. The Tx signal is transmitted, and flow returns to 701.

The methods 600 and 700 do not necessarily use the same α and β that is applied to the second processor 205 and the first processor 204. Nevertheless, it still may be desirable to have a similar $\alpha_{FProc}P_{acc,FProc}$ $\alpha_{SProc}P_{acc,SProc}$ so that the DAC in the center RFIC 402 operates in a relatively small range. Method 700 at the first processor 204 may be exactly the same as an existing one-stage CLPC system without a VGA gain update, which for a distributed CLPC is provided at 603 in method 600.

As an alternative to method 800, the first processor 204 may separately keep track of an accumulated VGA gain and $P_{acc,FProc}$. This alternative is referred to herein as Option 2. FIG. 8 is an example embodiment of a method 800 for a dual IF mode distributed CLPC system for the first processor (FProc) (Option 2) according to the subject matter disclosed herein. Note that Option 1 and 2 are essentially equivalent except for the implementation details in which for Option 2 the first processor 204 keep track of an accumulated VGA gain and accumulate $P_{acc,FProc}$ without adjusting the PDET reading, which is not done in Option 1.

The modem 201 periodically issues a PDET reading command. At 801 in FIG. 8, the second processor 205 determines whether a PDET reading command has been issued. If not, flow remains at 801. If so, flow continues to 802 where the first processor 204 or an adder (not shown) determines $G_{VGA}$ as $$G_{VGA}=G_{VGA,prev}+\Delta G_{VGA}, \tag{22}$$

$\Delta_{PC}$ is updated by the first processor 204 or by an adder (not shown) as $$\Delta_{PC}=P_{target}-P_{det,read,H}, \text{ and} \tag{23}$$

$P_{acc,FProc}$ is updated by the first processor 204 or by an adder (not shown) as $$P_{acc,FProc}=P_{acc,FProc}+\beta\Delta_{PC}. \tag{24}$$

At 803, the first processor 204 selects a gain index $G_{req}$ from a gain table based on $P_{lookup}=P_{target}$. At 804, the first processor 204 determines $DAC_{dB\_normal}$ as $$DAC_{db\_normal}=DAC_{set\_cal}+(P_{target}-P_{G_{req}})+ \\ \alpha_{P_{acc,FProc}}-G_{VGA}. \tag{25}$$

At 805, the first processor 204 determines $DAC_{req}$ as $$DAC_{req}=\max(\min(DAC_{dB\_normal},DAC_{max}),DAC_{min}). \tag{26}$$

At 806, the first processor communicates $G_{req}$ to the controller 203 and $DAC_{req}$ to the center RFIC 202. The Tx signal is transmitted, and flow returns to 801.

As another alternative to methods 600 and 700, instead of separately providing a PDET reading and a delta VGA gain, the second processor 205 may directly provide an adjusted PDET reading to the first processor 204. This may be equivalent to moving the determination of an adjusted PDET reading ($P_{det,read,adj}$) by the first processor 204 at 702 in method 700 to be performed by the second processor 205 in method 600.

For the single IF mode, the same dGain may be applied to both H and V polarizations. That is, the second processor 205 may separately select a VGA gain index for H ($GC_{req,H}$) and V ($GC_{req,V}$), and the first processor 204 may separately select an analog gain for H ($G_{req,H}$) and V ($G_{req,V}$) and a dGain ($DAC_{req}$) to meet a H+V power target. For Option 1 in the single IF mode, the second processor 205 may provide a delta VGA gain of H+V to the first processor 204.

Figures 9, 10:
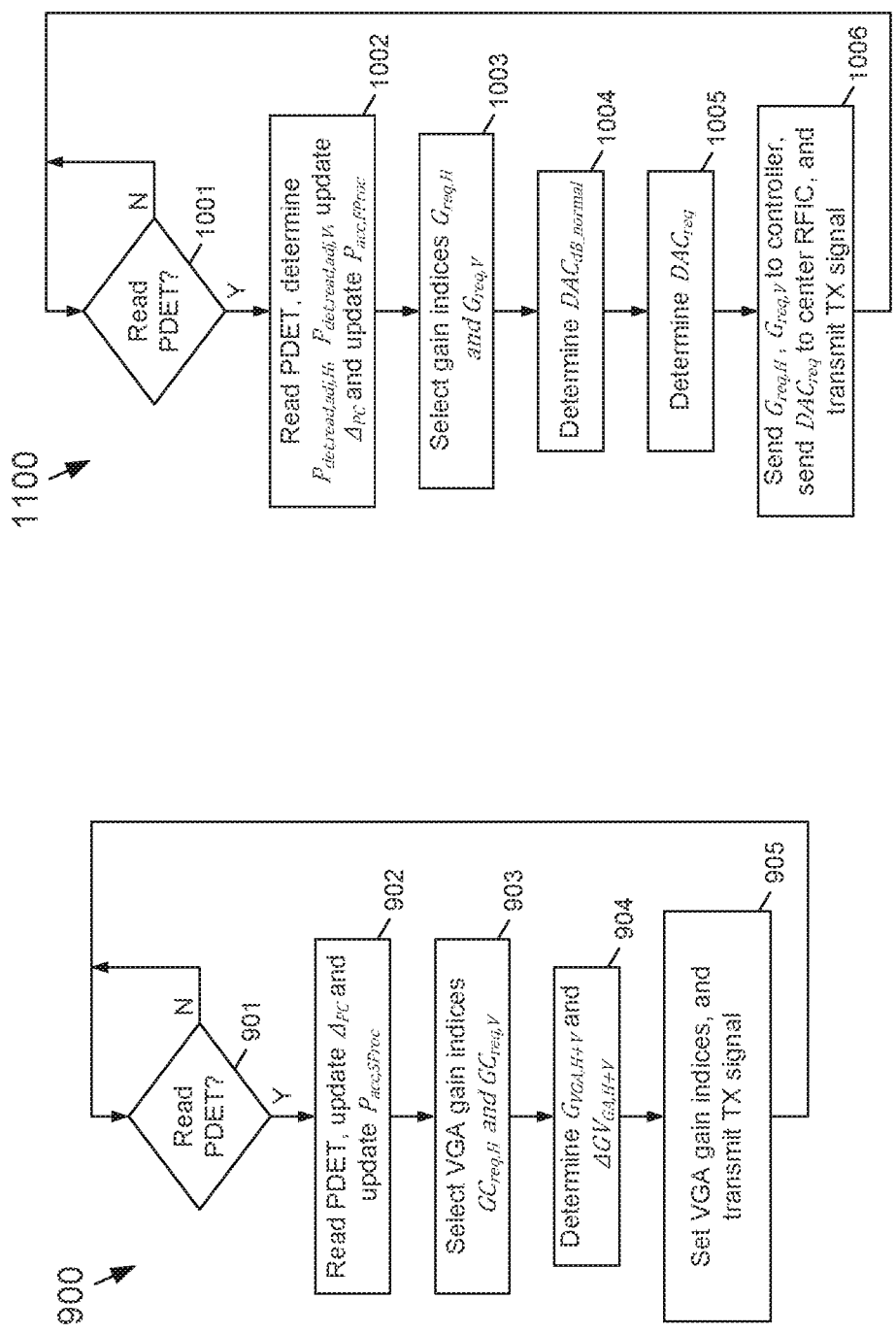
FIG. 9 is an example embodiment of a method for a single IF mode distributed CLPC system for the second processor (Option 1) according to the subject matter disclosed herein.
FIG. 10 is an example embodiment of a method for a single IF mode distributed CLPC system for the first processor (Option 1) according to the subject matter disclosed herein.

FIG. 9 is an example embodiment of a method 900 for a single IF mode distributed CLPC system for the second processor (SProc) 205 (Option 1) according to the subject matter disclosed herein. The modem 201 periodically issues a PDET reading command. At 901, the second processor 205 determines whether a PDET reading command has been issued. If not, flow remains at 901. If so, flow continues to 902 where the PDET 208 is read to obtain $P_{det,read}$. Additionally, $\Delta_{PC}$ is updated by the first adder 209 as $$\Delta_{PC} = P_{target} - 10\log_{10}\left(10^{\frac{P_{det,read,H}}{10}} + 10^{\frac{P_{det,read,V}}{10}}\right), \tag{25}$$

and $P_{acc,SProc}$ is updated by the second adder 210 as $$P_{acc,SProc}=P_{acc,SProc}\beta\Delta_{PC} \tag{26}$$

in which $P_{target}$ is the target power for H+V polarizations.

At 903, the second processor 205 selects VGA gain indices $GC_{req,H}$ for H and $GC_{req,V}$ for V based on $$GC_{req,H}=\underset{GC_i}{\operatorname{argmin}}|\alpha_{P_{acc,SProc}}-T_{VGA,H}(GC_i)+T_{VGA,H} \\ (GC_{cal,H})|, \text{ and} \tag{27}$$

$$GC_{req,V}=\underset{GC_i}{\operatorname{argmin}}|\alpha_{P_{acc,SProc}}-T_{VGA,V}(GC_i)+T_{VGA,V} \\ (GC_{cal,V})|. \tag{28}$$

At 904, $G_{VGA,H}$+V and $\Delta G_{VGA,H}$+V are determined by the second processor 205 as $$G_{VGA,H+V} = 10\log_{10}\left(10^{\frac{T_{VGA,H}(GC_{req,H})-T_{VGA,H}(GC_{cal,H})}{10}} + \\ 10^{\frac{T_{VGA,V}(GC_{req,V})-T_{VGA,V}(GC_{cal,V})}{10}}\right) \tag{29}$$

and $$\Delta G_{VGA,H+V}=G_{VA,H+V}-G_{VGA,H+V,prev}. \tag{30}$$

$\Delta G_{VGA,H+V}$ are communicated to the first processor 204. At 905, the second processor 205 sets the VGA gain index with $GC_{req,H}$ for H and $GC_{req,V}$ for V. The Tx signal is transmitted, and flow returns to 901.

FIG. 10 is an example embodiment of a method 1000 for a single IF mode distributed CLPC system for the first processor (FProc) 204 (Option 1) according to the subject matter disclosed herein. The modem 201 periodically issues a PDET reading command. At 1001, the second processor 205 determines whether a PDET reading command has been issued. If not, flow remains at 1001. If so, flow continues to 1002 where $P_{det,read,adj,H}$ and $P_{det,read,adj,V}$ are determined by the third adder 212 as $$P_{det,read,adj,H} = P_{det,read,H} + \frac{\Delta G_{VGA,H+V}}{\alpha\beta}, \text{ and} \tag{31}$$

$$P_{det,read,adj,V} = P_{det,read,V} + \frac{\Delta G_{VGA,H+V}}{\alpha\beta}, \tag{32}$$

$\Delta_{PC}$ is updated by the fourth adder 213 as $$\Delta_{PC} = P_{target} - 10\log_{10}\left(10^{\frac{P_{det,read,adj,H}}{10}} + 10^{\frac{P_{det,read,adj,V}}{10}}\right), \text{ and} \tag{33}$$

$P_{acc,FProc}$ is updated by the fifth adder 215 as $$P_{acc,FProc}=P_{acc,FProc}+\beta\Delta_{PC} \tag{34}$$

in which $P_{target}$ is the target power for H+V.

At 1003, the first processor 204 selects gain indices $G_{req,H}$ for H and $G_{req,V}$ for V from a H/V gain table according to $P_{lookup}=P_{target}-3$. At 1004, the first processor 204 determines $DAC_{dB\_normal}$ as $$DAC_{dB\_normal} = \\ DAC_{set\_cal} + \left(P_{target} - 10\log_{10}\left(10^{\frac{P_{G_{req,H}}}{10}} + 10^{\frac{P_{G_{req,V}}}{10}}\right)\right) + \alpha P_{acc,FProc}. \quad (35)$$

At 1005, the first processor 204 determines $DAC_{req}$ as $$DAC_{req}=\max(\min(DAC_{dB\_normal},DAC_{max}),DAC_{min}). \quad (36)$$

At 1006, the first processor 204 communicates $G_{req,H}$ for H and $G_{req,V}$ for V to the second processor 205, and communicates $DAC_{req}$ to the center RFIC 202. The Tx signal is transmitted, and flow returns to 1001.

It should be noted that for Option 1 when both the analog gain and the VGA gain are different for H and V, some spikes in output power may appear when the VGA gain selection changes. In Option 2, the second processor 205 provides $\Delta G_{VGA,H}$ and $\Delta G_{VGA,V}$ to the first processor 204. Having received this information, the first processor 204 may keep track of the adjusted VGA gain with respect to the VGA gain used in calibration. This may ensure that the VGA gain and dGain are updated consistently according to the accumulated error, thereby avoiding avoid spikes in output power that might occur in Option 1.

Figures 11, 12:
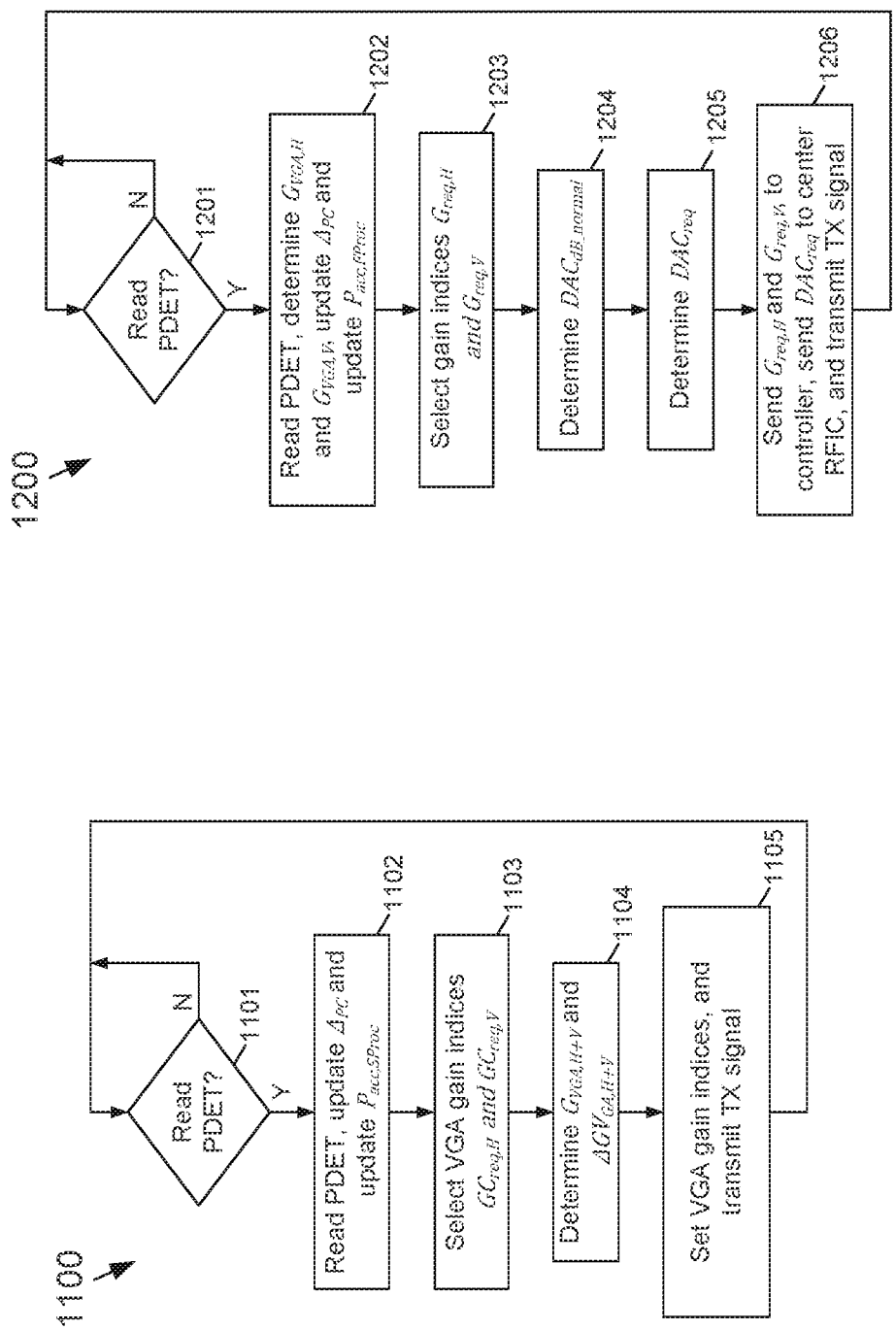
FIG. 11 is an example embodiment of a method for a single IF mode distributed CLPC system for the second processor according to the subject matter disclosed herein.
FIG. 12 is an example embodiment of a method for a single IF mode distributed CLPC system for the first processor (Option 2) according to the subject matter disclosed herein.

FIG. 11 is an example embodiment of a method 1100 for a single IF mode distributed CLPC system for the second processor (SProc) (Option 2) according to the subject matter disclosed herein. The modem 201 periodically issues a PDET reading command. At 1101, the second processor 205 determines whether a PDET reading command has been issued. If and not, flow remains at 1101. If so, flow continues to 1102 where the PDET is read to obtain $P_{det,read}$. Additionally, $\Delta_{PC}$ is updated by the first adder 209 as $$\Delta_{PC} = P_{target} - 10\log_{10}\left(10^{\frac{P_{det,read,H}}{10}} + 10^{\frac{P_{det,read,V}}{10}}\right), \quad (37)$$

and $P_{acc,SProc}$ is updated by the second adder 201 as $$P_{acc,SProc}=P_{acc,SProc}+\beta\Delta_{PC} \quad (38)$$

in which $P_{target}$ is the target power for H+V polarizations.

At 1103, the second processor 205 selects VGA gain indices $GC_{req,H}$ for H and $GC_{req,V}$ for V based on $$GC_{req,H}=^{argmin}_{GC_i}|\alpha P_{acc,SProc}-T_{VGA,H}(GC_i)+T_{VGA,H}(GC_{cal,H})|, \text{ and} \quad (39)$$

$$GC_{req,V}=^{argmin}_{GC_i}|\alpha P_{acc,SProc}-T_{VGA,V}(GC_i)+T_{VGA,V}(GC_{cal,V})|. \quad (40)$$

At 1104, the second processor 205 determines $G_{VGA,H+V}$ and $\Delta G_{VGA,H+V}$ as $$\Delta G_{VGA,H}=T_{VGA,H}(GC_{req,H})T_{VGA,H}(GC_{req,H,prev}) \quad (41)$$

$$\Delta G_{VGA,V}=T_{VGA,V}(GC_{req,V})-T_{VGA,V}(GC_{req,V,prev}). \quad (42)$$

The second processor 205 provides $\Delta G_{VGA,H}$ and $\Delta G_{VGA,V}$ to the first processor 204. At 1105, the second processor 205 sets the VGA gain indices to be $GC_{req,H}$ for H and $GC_{req,V}$ for V. The Tx signal is transmitted, and flow returns to 1101.

FIG. 12 is an example embodiment of a method 1200 for a single IF mode distributed CLPC system for the first processor (FProc) 404 (Option 2) according to the subject matter disclosed herein. The modem 201 periodically issues a PDET reading command. At 1201, the second processor 205 determines whether a PDET reading command has been issued. If not, flow remains at 1201. If so, flow continues to 1202 where $G_{VGA,H}$ and $G_{VGA,V}$ are determined by separate adders (not shown) as $$G_{VGA,H}=G_{VGA,H,prev}+\Delta G_{VGA,H}, \text{ and} \quad (43)$$

$$G_{VGA,V}=G_{VGA,V,prev}+\Delta G_{VGA,V}. \quad (44)$$

$\Delta_{PC}$ is updated by an adder (not shown) as $$\Delta_{PC} = P_{target} - 10\log_{10}\left(10^{\frac{P_{det,read,H}}{10}} + 10^{\frac{P_{det,read,V}}{10}}\right), \text{ and} \quad (45)$$

$P_{acc,FProc}$ is updated another adder (not shown) as $$P_{acc,FProc}=P_{acc,FProc}+\beta\Delta_{PC} \quad (46)$$

in which $P_{target}$ is the target power for H+V.

At 1203, the first processor 204 selects gain indices $G_{req,H}$ for H and $G_{req,V}$ for V from a H/V gain table according to $P_{lookup}=P_{target}-3$. At 1204, the first processor 204 determines $DAC_{dB\_normal}$ as $$DAC_{dB_{normal}} = DAC_{set_{cal}} + \\ \left(P_{target} - 10\log_{10}\left(10^{\frac{P_{G_{req,H}}+G_{VGA,H}}{10}} + 10^{\frac{P_{G_{req,V}}+G_{VGA,V}}{10}}\right)\right) + \\ \alpha P_{acc,FProc}. \quad (47)$$

At 1205, the first processor 204 determines $DAC_{req}$ as $$DAC_{req}=\max(\min(DAC_{dB\_normal},DAC_{max}),DAC_{min}). \quad (48)$$

At 1206, the first processor communicates $G_{req,H}$ for H and $G_{req,V}$ for V to the controller 203, and communicates $DAC_{req}$ to the center RFIC 402. The Tx signal is transmitted, and flow returns to 1201.

A comparison between Option 1 and 2 shows that in Option 2, the first processor 204 tracks the updated VGA gain in 1102 so that a DAC value may be selected accordingly in 1103, which is not in Option 1. This may ensure an equivalence to a centralized CLPC process and smooth convergence may be expected. Option 2 may be equivalent to a centralized CLPC process and may outperform Option 1. Option 1 and 2 may be equivalent if the selected analog gain or the VGA gain are the same for H and V. Option 2 does not involve the same $\alpha$ or $\beta$ to be applied to the second processor 205 and the first processor 204. Nevertheless, it may be desirable to have a similar $\alpha_{FProc}P_{acc,FProc}$ and $\alpha_{SProc}P_{acc,SProc}$ so that the dGain may be adjusted in a small range. If $\alpha_{SProc}P_{acc,SProc}$ is comparably relatively small, a VGA gain update may be slow and a dGain may be primarily used for temperature compensation until the dGain becomes saturated. If $\alpha_{SProc}P_{acc,SProc}$ is comparably relatively large, a VGA gain may compensate so aggressively that dGain may back off significantly until the dGain drops out of a working operational range.

FIG. 13 is an example embodiment of a method 1300 of a joint optimization of dGain and H/V gain for a centralized CLPC system, single IF mode (Option 1) according to the subject matter disclosed herein. The focus of the method 1300 is to drive the powers for the H and V polarizations to the target power, but also so that the powers for the H and V polarizations have similar values, that is, balanced powers for the H and V polarizations. In FIG. 13, the modem 101 periodically issues a PDET reading command. At 1301, the second processor 105 determines whether a PDET reading command has been issued. If not, flow remains at 1301. If so, flow continues to 1302 where the PDET 108 is read to obtain $P_{det,read,H}$ and $P_{det,read,V}$. Additionally at 1302, $\Delta_{PC,H}$ and $\Delta_{PC,V}$ are updated by adders (not shown, but corresponding to the first adder 109) as $$\Delta_{PC,H}=P_{target}-P_{det,read,H}-\varepsilon_H, \text{ and} \quad (49)$$

$$\Delta_{PC,V}=P_{target}-P_{det,read,V}-\varepsilon_V \quad (50)$$

in which $P_{target}$ is the target power for a single polarization, and $\varepsilon_H$ and $\varepsilon_V$ are respectively bias terms for the H polarization and the V polarization.

Also at 1302, additional adders (not shown, but corresponding to the second adder 110) update $P_{acc,H}$ and $P_{acc,V}$ as $$P_{acc,H}=P_{acc,H}+\beta\Delta_{PC,H}, \text{ and} \quad (51)$$

$$P_{acc,V}=P_{acc,V}+\beta\Delta_{PC,V}. \quad (52)$$

At 1303, the first processor 104 determines $GC_{req}$,H and $GC_{req}$,v based on $$[GC_{req,H},GC_{req,V}]={}_{GC_H,GC_V}^{argmin}|\alpha P_{acc,H}-G_{VGA,H}(GC_H)-(\alpha P_{acc,V}-G_{VGA,V}(GC_V))| \quad (53)$$

$$|\alpha P_{acc,H}-G_{VGA,H}(GC_H)|\leq TH1$$

$$|\alpha P_{acc,H}-G_{VGA,V}(GC_V)|\leq TH1$$

in which $G_{VGA,H}(GC_H)=T_{VGA,H}(GC_H)-T_{VGA,H}(GC_{cal,H})$ and $G_{VGA,V}(GC_V)=T_{VGA,V}(GC_V)-T_{VGA,V}(GC_{cal,V})$.

If such a solution does not exist, the first processor 105 determines $GC_{req,H}$ and $GC_{req,V}$ based on $$GC_{req,H}={}_{GC_H}^{argmin}|\alpha P_{acc,H}-G_{VGA,H}(GC_H)|$$
$$GC_{req,V}={}_{GC_V}^{argmin}|\alpha P_{acc,V}-G_{VGA,V}(GC_V)|. \quad (54)$$

At 1304, the first processor 105 selects gain indexes for $G_{req,H}$ and $G_{req,V}$ from a VGA lookup table based on $P_{lookup}=P_{target}$.

At 1305, the first processor 105 determines $DAC_{dB\_normal}$ as $$DAC_{dB\_normal}=DAC_{set\_cal}+dGain, \quad (55)$$

in which $$dGain = \frac{\alpha P_{acc,H} - G_{VGA,H}(GC_{req,H}) + \alpha P_{acc,V} - G_{VGA,V}(GC_{req,V})}{2}.$$

At 1306, the first processor 104 determines the bias terms $\varepsilon_H$ and $\varepsilon_V$ as $$\varepsilon_H=\alpha P_{acc,H}-G_{VGA,H}(GC_H)-dGain, \text{ and} \quad (56)$$

$$\varepsilon_V=-\varepsilon_H. \quad (57)$$

The bias terms $\varepsilon_H$ and $\varepsilon_V$ provide an indication about how far the H and V power values are away from the target power value. If, for example, $\varepsilon_H$ is 0.5 dB, the system will drive the H power value to be about 0.5 dB above the target power value and the V power value to be about 0.5 dB below the target power value. With bias terms tend to remove spikes in the power operation.

At 1307, the first processor determines $DAC_{req}$ as $$DAC_{req}=\max(\min(DAC_{dB\_normal},DAC_{max}),DAC_{min}). \quad (58)$$

At 1308, the first processor 104 respectively sets $GC_{req}$,H and $GC_{req,V}$ to the selected VGA gains for the H and V polarizations, which are sent to the controller 103 with the gain indexes for $G_{req,H}$ and $G_{req,V}$. The first processor 104 also communicates the $DAC_{req}$ to the center RFIC 102. The Tx signal is transmitted by the controller 103, and flow returns to 1301.

FIG. 14 is an example embodiment of a method 1400 of a joint optimization of dGain and H/V gain for a centralized CLPC system, single IF mode (Option 2) according to the subject matter disclosed herein. Option 2 differs from Option 1 (i.e., method 1300) by determining the H and V polarization VGA gains separately, which reduces complexity at the cost of a possibly slight increased power difference between the H and V polarizations. For a given VGA gain step Δ, Option 2 provides a power difference for the H and V polarization of less than Δ/2.

In FIG. 14, the modem 101 periodically issues a PDET reading command. At 1401, the second processor 105 determines whether a PDET reading command has been issued. If not, flow remains at 1401. If so, flow continues to 1402 where the PDET 108 is read to obtain $P_{det,read,H}$ and $P_{det,read,V}$. Additionally at 1402, $\Delta_{PC,H}$ and $\Delta_{PC,V}$ are updated by adders (not shown, but corresponding to the first adder 109) as $$\Delta_{PC,H}=P_{target}-P_{det,read,H}-\varepsilon_H, \text{ and} \quad (59)$$

$$\Delta_{PC,V}=P_{target}-P_{det,read,V}-\varepsilon_V. \quad (60)$$

in which $P_{target}$ is the target power for a single polarization, and $\varepsilon_H$ and $\varepsilon_V$ are respectively bias terms for the H polarization and the V polarization.

Also at 1402, additional adders (not shown, but corresponding to the second adder 110) update $P_{acc,H}$ and $P_{acc,V}$ as $$P_{acc,H}=P_{acc,H}+\beta\alpha_{PC,H}, \text{ and} \quad (61)$$

$$P_{acc,V}=P_{acc,V}-\beta\Delta_{PC,V}. \quad (62)$$

At 1403, if $P_{acc,H}<P_{acc,V}$, the first processor 101 determines $GC_{req,H}$ and $GC_{req,V}$, as $$GC_{req,H}={}_{GC_H}^{argmin}|\alpha P_{acc,H}-G_{VGA,H}(GC_H)|, \text{ and} \quad (63)$$

$$GC_{req,V}={}_{GC_V}^{argmin}|\alpha P_{acc,V}-(\alpha P_{acc,H}-G_{VGA,H}(GC_{req,H}))-G_{VGA,V}(GC_V)|. \quad (64)$$

If $P_{acc,H}\geq P_{acc,V}$, the first processor 101 determines $GC_{req,V}$ and $GC_{req,H}$ as $$GC_{req,V}={}_{GC_V}^{argmin}|\alpha P_{acc,V}-G_{VGA,V}(GC_V)|, \text{ and} \quad (65)$$

$$GC_{req,H}={}_{GC_H}^{argmin}|\alpha P_{acc,H}-(\alpha P_{acc,V}-G_{VGA,V}(GC_{req,V}))-G_{VGA,H}(GC_H)|. \quad (66)$$

At 1404, the first processor 105 selects gain indexes for $G_{req,H}$ and $G_{req,V}$ from a VGA lookup table based on $P_{lookup}=P_{target}$.

At 1405, the first processor 105 determines $DAC_{dB\_normal}$ as $$DAC_{dB\_normal}=DAC_{set\_cal}+dGain, \quad (67)$$

in which $$dGain = \frac{\alpha P_{acc,H} - G_{VGA,H}(GC_{req,H}) + \alpha P_{acc,V} - G_{VGA,V}(GC_{req,V})}{2}.$$

At 1406, the first processor 104 determines the bias terms $\varepsilon_H$ and $\varepsilon_V$ as $$\varepsilon_H = \alpha P_{acc,H} - G_{VGA,H}(GC_H) - \text{dGain, and} \tag{68}$$

$$\varepsilon_V = -\varepsilon_H. \tag{69}$$

At 1407, the first processor determines $DAC_{req}$ as $$DAC_{req} = \max(\min(DAC_{dB\_normal}, DAC_{max}), DAC_{min}). \tag{67}$$

At 1408, the first processor 104 respectively sets $GC_{req,H}$ and $GC_{req,V}$ to the selected VGA gains for the H and V polarizations, which are sent to the controller 103 with the gain indexes for $G_{req,H}$ and $G_{req,V}$. The first processor 104 also communicates the $DAC_{req}$ to the center RFIC 102. The Tx signal is transmitted by the controller 103, and flow returns to 1301.

Figure 15:
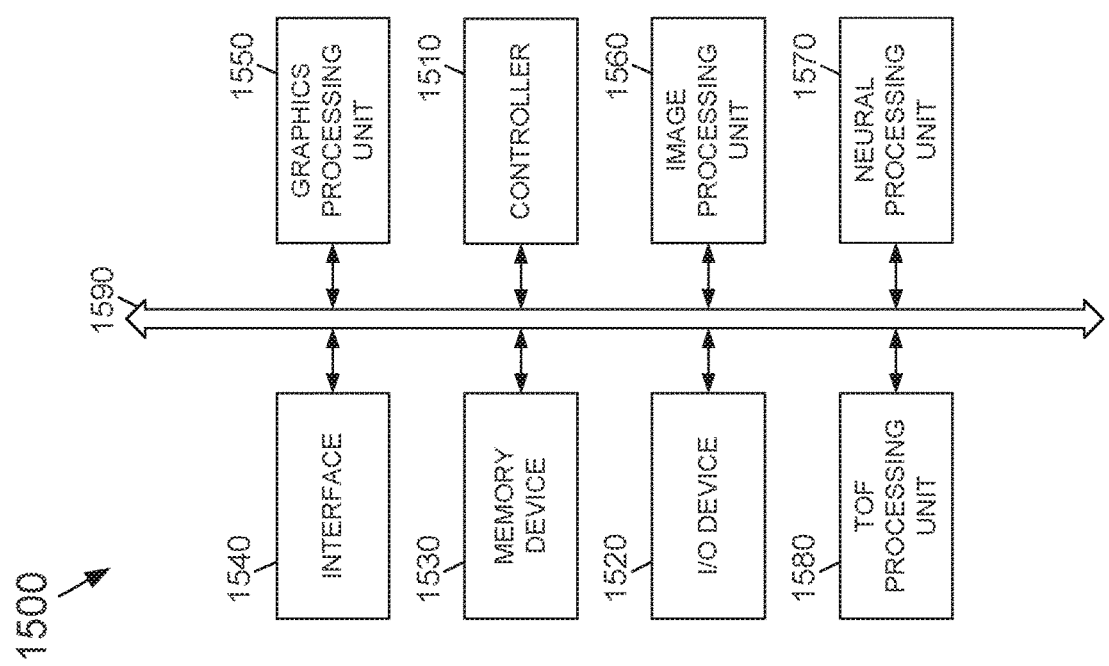
FIG. 15 depicts an electronic device that may include a centralized and/or a distributed CLPC system according to the subject matter disclosed herein

FIG. 15 depicts an electronic device 1500 that may include a centralized and/or a distributed CLPC system according to the subject matter disclosed herein. Electronic device 1500 and the various system components of electronic device 1500 may be formed from one or more modules. The electronic device 1300 may include a controller (or CPU) 1510, an input/output device 1520 such as, but not limited to, a keypad, a keyboard, a display, a touch-screen display, a 2D image sensor, a 3D image sensor, a memory 1530, an interface 1540, a GPU 1550, an imaging-processing unit 1560, a neural processing unit 1570, a TOF processing unit 1380 that are coupled to each other through a bus 1590. The controller 1510 may include, for example, at least one microprocessor, at least one digital signal processor, at least one microcontroller, or the like. The memory 1530 may be configured to store a command code to be used by the controller 1510 and/or to store a user data.

The interface 1540 may be configured to include a wireless interface that is configured to transmit data to or receive data from, for example, a wireless communication network using a RF signal. In one embodiment, the wireless interface 1540 may include a centralized or a distributed CLPC system according to the subject matter disclosed herein. The wireless interface 1540 may include, for example, an antenna. The electronic system 1500 also may be used in a communication interface protocol of a communication system, such as, but not limited to, Code Division Multiple Access (CDMA), Global System for Mobile Communications (GSM), North American Digital Communications (NADC), Extended Time Division Multiple Access (E-TDMA), Wideband CDMA (WCDMA), CDMA2000, Wi-Fi, Municipal Wi-Fi (Muni Wi-Fi), Bluetooth, Digital Enhanced Cordless Telecommunications (DECT), Wireless Universal Serial Bus (Wireless USB), Fast low-latency access with seamless handoff Orthogonal Frequency Division Multiplexing (Flash-OFDM), IEEE 802.20, General Packet Radio Service (GPRS), iBurst, Wireless Broadband (WiBro), WiMAX, WiMAX-Advanced, Universal Mobile Telecommunication Service-Time Division Duplex (UMTS-TDD), High Speed Packet Access (HSPA), Evolution Data Optimized (EVDO), Long Term Evolution-Advanced (LTE-Advanced), Multichannel Multipoint Distribution Service (MMDS), Fifth-Generation Wireless (5G), Sixth-Generation Wireless (6G), and so forth.

Embodiments of the subject matter and the operations described in this specification may be implemented in digital electronic circuitry, or in computer software, firmware, or hardware, including the structures disclosed in this specification and their structural equivalents, or in combinations of one or more of them. Embodiments of the subject matter described in this specification may be implemented as one or more computer programs, i.e., one or more modules of computer-program instructions, encoded on computer-storage medium for execution by, or to control the operation of data-processing apparatus. Alternatively or additionally, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer-storage medium can be, or be included in, a computer-readable storage device, a computer-readable storage substrate, a random or serial-access memory array or device, or a combination thereof. Moreover, while a computer-storage medium is not a propagated signal, a computer-storage medium may be a source or destination of computer-program instructions encoded in an artificially-generated propagated signal. The computer-storage medium can also be, or be included in, one or more separate physical components or media (e.g., multiple CDs, disks, or other storage devices). Additionally, the operations described in this specification may be implemented as operations performed by a data-processing apparatus on data stored on one or more computer-readable storage devices or received from other sources.

While this specification may contain many specific implementation details, the implementation details should not be construed as limitations on the scope of any claimed subject matter, but rather be construed as descriptions of features specific to particular embodiments. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the embodiments described above should not be understood as requiring such separation in all embodiments, and it should be understood that the described program components and systems can generally be integrated together in a single software product or packaged into multiple software products.

Thus, particular embodiments of the subject matter have been described herein. Other embodiments are within the scope of the following claims. In some cases, the actions set forth in the claims may be performed in a different order and still achieve desirable results. Additionally, the processes depicted in the accompanying figures do not necessarily require the particular order shown, or sequential order, to achieve desirable results. In certain implementations, multitasking and parallel processing may be advantageous.

As will be recognized by those skilled in the art, the innovative concepts described herein may be modified and varied over a wide range of applications. Accordingly, the scope of claimed subject matter should not be limited to any of the specific exemplary teachings discussed above, but is instead defined by the following claims.

What is claimed is:

1. A closed-loop power control system, comprising:
a first power amplifier;
a first output power detector configured to detect a first output power level Pdet of the first power amplifier;
a first processor configured to determine a first analog gain Greq for a first controller and a first gain dGain for a first digital-to-analog converter (DAC) based on a first accumulated error between the first output power level Pdet and a target Effective Isotropically Radiated Power (EIRP), wherein the first accumulated error is weighted based on a resource block size; and
a second processor configured to set a first variable gain GCreq of a first variable gain amplifier (VGA) coupled to an input of the first power amplifier.

2. The closed-loop power control system of claim 1, wherein the first processor is further configured to communicate the first analog gain Greq to the first controller.

3. The closed-loop power control system of claim 1, wherein the first processor is further configured to determine the first analog gain Greq and the first gain dGain based on the first weighted accumulated error between the first output power level Pdet and the target EIRP.

4. The closed-loop power control system of claim 1, wherein the first processor is further configured to determine the first variable gain GCreq of the first VGA, and communicate the first variable gain GCreq to the first controller.

5. The closed-loop power control system of claim 1, wherein the second processor is further configured to determine the first variable gain GCreq.

6. The closed-loop power control system of claim 5, wherein the second processor determines the first variable gain GCreq based on a second accumulated error between the first output power level Pdet and the target EIRP.

7. The closed-loop power control system of claim 5, wherein the second processor determines the first variable gain GCreq based on a second weighted accumulated error between the first output power level Pdet and the target EIRP.

8. The closed-loop power control system of claim 1, wherein the system comprises a first signal path for a first polarization and a second signal path for a second polarization,
wherein the first signal path comprises the first power amplifier, the first output power detector, the first processor, the first DAC, the first controller, and the second processor, and
wherein the second signal path comprises:
a second power amplifier;
a second output power detector configured to detect a second output power level Pdet of the second power amplifier;
a third processor configured to determine a second analog gain Greq for a second controller and a second gain dGain for a second DAC based on a second accumulated error between the second output power level Pdet and the target EIRP; and
a fourth processor configured to set a second variable gain GCreq of a second VGA coupled to an input of the second power amplifier.

9. The closed-loop power control system of claim 1, wherein the system comprises a first signal path for a first polarization and a second signal path for a second polarization,
wherein the first signal path comprises the first power amplifier, the first output power detector, the first processor, the first controller and the second processor,
wherein the second signal path comprises a second controller, a third processor, a second VGA, and a second power amplifier, and
wherein the first processor is further configured to communicate the first analog gain Greq to the second controller and the third processor is further configured to set a second variable gain GCreq of the second VGA coupled to an input of the second power amplifier.

10. The closed-loop power control system of claim 9, wherein the first processor is further configured to communicate the first variable gain GCreq to the first controller and to the second controller.

11. The closed-loop power control system of claim 1, wherein the system comprises a first signal path for a first polarization and a second signal path for a second polarization,
wherein the first signal path comprises the first power amplifier, the first output power detector, the first processor, the first DAC, the first controller, and the second processor,
wherein the second signal path comprises a second DAC, a second controller, a third processor, a second VGA, and a second power amplifier,
wherein the first analog gain Greq comprises a gain for the first signal path, the first gain dGain comprises a gain for the first DAC and a gain for the second DAC, and the first variable gain GCreq comprises a gain of the first VGA, and
wherein the first processor is further configured to determine a second analog gain Greq for the second signal path and a second variable gain GCreq for the second VGA, the second variable gain GCreq being within a predetermined difference from the first variable gain GCreq.

12. A closed-loop power control system, comprising:
a first signal path for a first polarization and a second signal path for a second polarization, the first signal path comprising:
a first power amplifier;
a first output power detector configured to detect a first output power level Pdet of the first power amplifier;
a first processor configured to determine a first analog gain Greq for a first controller and a first gain dGain for a first digital-to-analog converter (DAC) based on a first accumulated error between the first output power level Pdet and a target Effective Isotropically Radiated Power (EIRP), wherein the first accumulated error is weighted based on a resource block size; and
a second processor configured to set a first variable gain $GC_{req}$ of a first variable gain amplifier (VGA) coupled to an input of the first power amplifier.

13. The closed-loop power control system of claim 12, wherein the first processor is further configured to communicate the first analog gain Greq to the first controller.

14. The closed-loop power control system of claim 12, wherein the first processor is further configured to determine the first analog gain Greq and the first gain dGain based on the first weighted accumulated error between the first output power level Pdet and the target EIRP.

15. The closed-loop power control system of claim 12, wherein the first processor is further configured to determine the first variable gain $GC_{req}$ of the first VGA, and communicate the first variable gain $GC_{req}$ to the first controller.

16. The closed-loop power control system of claim 12, wherein the second processor is further configured to determine the first variable gain $GC_{req}$.

17. The closed-loop power control system of claim 16, wherein the second processor determines the first variable gain $GC_{req}$ based on a second accumulated error between the first output power level Pdet and the target EIRP.

18. The closed-loop power control system of claim 16, wherein the second processor determines the first variable gain $GC_{req}$ based on a second weighted accumulated error between the first output power level $P_{det}$ and the target EIRP.

19. The closed-loop power control system of claim 12, wherein
the second signal path comprises:
a second power amplifier;
a second output power detector configured to detect a second output power level $P_{det}$ of the second power amplifier;
a third processor configured to determine a second analog gain Greq for a second controller and a second gain dGain for a second DAC based on a second accumulated error between the second output power level Pdet and the target EIRP.

20. The closed-loop power control system of claim 12, wherein the second signal path comprises a second controller, a third processor, a second VGA, and a second power amplifier, and
wherein the first processor is further configured to communicate the first analog gain Greq to the second controller.

21. The closed-loop power control system of claim 20, wherein the first processor is further configured to communicate the first variable gain $GC_{req}$ to the first controller and to the second controller.

* * * * *